(12) United States Patent
Furuhata et al.

(10) Patent No.: US 8,288,926 B2
(45) Date of Patent: *Oct. 16, 2012

(54) TUNING-FORK RESONATOR HAVING JUXTAPOSED GROOVES

(75) Inventors: Makoto Furuhata, Matsumoto (JP); Takashi Yamazaki, Shiojiri (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/331,602

(22) Filed: Dec. 20, 2011

(65) Prior Publication Data

US 2012/0092084 A1    Apr. 19, 2012

Related U.S. Application Data

(63) Continuation of application No. 13/083,945, filed on Apr. 11, 2011, now Pat. No. 8,102,103, which is a continuation of application No. 12/892,096, filed on Sep. 28, 2010, now Pat. No. 7,944,132.

(30) Foreign Application Priority Data

Oct. 1, 2009 (JP) .................................. 2009-229290
Jul. 27, 2010 (JP) .................................. 2010-167853

(51) Int. Cl.
*H03H 9/19* (2006.01)

(52) U.S. Cl. ..................................... 310/370

(58) Field of Classification Search ............... 310/370
See application file for complete search history.

(56) References Cited

U.S. PATENT DOCUMENTS

| | | | |
|---|---|---|---|
| 4,384,232 A * | 5/1983 | Debely | 310/370 |
| 6,897,737 B2 * | 5/2005 | Sakata et al. | 331/156 |
| 6,911,765 B2 | 6/2005 | Kawashima | |
| 7,015,630 B2 * | 3/2006 | Tanaya | 310/370 |
| 7,168,319 B2 * | 1/2007 | Dalla Piazza et al. | 73/504.16 |

(Continued)

FOREIGN PATENT DOCUMENTS

JP       02-032229       2/1990

(Continued)

OTHER PUBLICATIONS

Roszhart, T.V. "The Effect of Thermoelastic Internal Friction on the Q of Micromachined Silicon Resonators", Kearfott Guidance & Navigation Corporation, Little Falls, NJ, Solid-State Sensor and Actuator Workshop, 1990 4th Technical Digest, IEEE Explore, pp. 12-16, Jun. 1990.

*Primary Examiner* — J. San Martin
(74) *Attorney, Agent, or Firm* — Harness, Dickey & Pierce, P.L.C.

(57) ABSTRACT

A resonator having a base part; and a resonating arm that performs flexing vibration, the resonating arm part has two principal surfaces, a first groove provided on the one principal surface, a second groove provided in juxtaposition with the first groove on the other principal surface, a third groove provided in juxtaposition with the first groove and provided nearer the base part side than the first groove on the other principal surface, and a fourth groove provided in juxtaposition with the second groove and provided nearer the base part side than the second groove on the principal surface. The sum of a depth of the first and second groove part and a sum of a depth of the third and fourth groove part are larger than a distance between the one principal surface and the other principal surface.

13 Claims, 8 Drawing Sheets

U.S. PATENT DOCUMENTS

| | | | |
|---|---|---|---|
| 7,851,980 B2 * | 12/2010 | Kizaki | 310/370 |
| 7,932,664 B2 | 4/2011 | Yamazaki et al. | |
| 2010/0207495 A1 * | 8/2010 | Kikushima et al. | 310/370 |
| 2010/0277041 A1 * | 11/2010 | Yamazaki et al. | 310/367 |
| 2011/0115342 A1 | 5/2011 | Yang et al. | |

FOREIGN PATENT DOCUMENTS

| | | |
|---|---|---|
| JP | 2002-204141 | 7/2002 |
| JP | 2004135052 A * | 4/2004 |
| JP | 2004-200917 | 7/2004 |
| JP | 2004-260249 | 9/2004 |
| JP | 2005-151423 | 6/2005 |
| JP | 2008252800 | 10/2008 |
| JP | 2009060347 | 3/2009 |
| JP | 2009105926 | 5/2009 |
| JP | 2009105927 | 5/2009 |
| JP | 2010226608 | 10/2010 |
| WO | 00-044092 | 7/2000 |

* cited by examiner

TUNING-FORK RESONATOR HAVING JUXTAPOSED GROOVES

CROSS-REFERENCE TO RELATED APPLICATIONS

This application is a continuation application of U.S. application Ser. No. 13/083,945 filed Apr. 11, 2011, which is a continuation of U.S. application Ser. No. 12/892,096 filed Sep. 28, 2010 (now U.S. Pat. No. 7,944,132 issued May 17, 2011), claiming priority to Japanese Patent Application Nos. 2009-229290 filed Oct. 1, 2009 and 2010-167853 filed Jul. 27, 2010, all of which are hereby expressly incorporated by reference herein in their entireties.

BACKGROUND

1. Technical Field

The present invention relates to a resonator element, a resonator, an oscillator, and an electronic apparatus.

2. Related Art

In related art, it is known that, as a piezoelectric resonator element as an example of a resonator element is made smaller, the Q factor becomes smaller and vibration is hindered.

Specifically, in the piezoelectric resonator element, with elastic deformation due to flexing vibration, the temperature of the contracting surface rises and the temperature of the expanding surface falls, and a temperature difference is produced within. Thereby, in the piezoelectric resonator element, vibration called relaxation oscillation occurs in inverse proportion to a required time (relaxation time) until the temperature difference is eliminated (temperature equilibration) by thermal conduction (heat transfer).

As the piezoelectric resonator element is made smaller, the frequency of the relaxation oscillation and the frequency of the original flexing vibration come closer, and a phenomenon that the Q factor becomes smaller and the original flexing vibration is hindered occurs.

This phenomenon is called thermoelastic loss or thermoelastic effect, and, as measures therefor, in JP-UM-A-2-32229, a groove or a through hole is formed in the rectangular section of the piezoelectric resonator element to suppress the heat transfer from the contracting surface to the expanding surface, and thereby, reduction of the Q factor caused by thermoelastic loss is suppressed.

However, if a through hole is formed in the vibrating part (hereinafter, referred to as "resonating arm part") of the piezoelectric resonator element as in JP-UM-A-2-32229, there is a problem that the stiffness of the resonating arm part is significantly reduced.

Further, if the piezoelectric resonator element is provided with an H-shaped groove (hereinafter, referred to as "groove part") in the resonating arm part as in JP-UM-A-2-32229, the suppression of the heat transfer from the contracting surface to the expanding surface is insufficient and there is room for improvement in suppression of the reduction of the Q factor caused by thermoelastic loss.

SUMMARY

An advantage of some aspects of the invention is to solve at least a part of the problems mentioned above and the invention can be embodied as the following embodiments or application examples.

Application Example 1

A piezoelectric resonator element according to this application example includes a base part, and a resonating arm part that extends from the base part and performs flexing vibration, wherein the resonating arm part has one principal surface and the other principal surface opposed to the one principal surface, a first groove part formed along an extension direction of the resonating arm part on the one principal surface, a second groove part formed in parallel with the first groove part in a plan view on the other principal surface, a third groove part formed in series with the first groove part in the plan view nearer the base part side than the first groove part on the other principal surface, and a fourth groove part formed in series with the second groove part in the plan view nearer the base part side than the second groove part on the one principal surface, and wherein a sum of a depth of the first groove part and a depth of the second groove part and a sum of a depth of the third groove part and a depth of the fourth groove part are larger than a distance between the one principal surface and the other principal surface.

According to the configuration, the piezoelectric resonator element has the first groove part on the one principal surface and the second groove part formed in parallel with the first groove part on the other principal surface. Further, the piezoelectric resonator element has the third groove part formed in series with the first groove part nearer the base part than the first groove part on the other principal surface, and the fourth groove part formed in series with the second groove part nearer the base part than the second groove part on the one principal surface.

Further, in the piezoelectric resonator element, the sum of the depth of the first groove part and the depth of the second groove part and the sum of the depth of the third groove part and the depth of the fourth groove part are larger than the distance between the one principal surface and the other principal surface.

Thereby, in the piezoelectric resonator element, for example, compared to the case where groove parts having H-shaped sections are provided in the resonating arm part as in related art, the distance of heat transfer from one of the pair of contracting and expanding surfaces as a contracting surface in the flexing vibration to the other of the pair of contracting and expanding surfaces as an expanding surface are longer, and thus, the relaxation time until the temperature equilibration is achieved becomes longer.

As a result, regarding the piezoelectric resonator element, the frequency of the relaxation oscillation is made farther from the frequency of the original flexing vibration, and the reduction of the Q factor due to thermoelastic loss can be suppressed. Therefore, the piezoelectric resonator element can be further downsized.

Now, in the piezoelectric resonator element, the sectional shape containing the first groove part and the second groove part cut along the surface orthogonal to the one principal surface of the resonating arm part and orthogonal to the extension direction of the resonating arm part passes through the middle point of the straight line connecting the one principal surface and the other principal surface, and is not a line-symmetric shape with respect to a center line between the one principal surface and the other principal surface as a straight line along the one principal surface (other principal surface) as an axis of symmetry.

Thereby, under the condition, in the piezoelectric resonator element, mass imbalance is generated in the resonating arm part, and the flexing vibration is vibration formed by synthesizing the original flexing vibration component along the one principal surface and the out-of-plane vibration component vibrating in the thickness direction as a direction connecting the one principal surface and the other principal surface.

As a result, in the piezoelectric resonator element, the vibration direction of the flexing vibration is no longer along the specified vibration direction, and the loss of vibration energy is generated and the efficiency of the flexing vibration becomes lower.

On the other hand, in the piezoelectric resonator element, the sectional shape containing the third groove part and the fourth groove part cut along the surface orthogonal to the one principal surface of the resonating arm part and orthogonal to the extension direction of the resonating arm part is a shape formed by inverting the sectional shape containing the first groove part and the second groove part, and the flexing vibration is vibration formed by synthesizing the original flexing vibration component along the one principal surface and the out-of-plane vibration component vibrating in the thickness direction as is the case described above.

In this regard, in the piezoelectric resonator element, the sectional shape containing the third groove part and the fourth groove part is the shape formed by inverting the sectional shape containing the first groove part and the second groove part, and thus the direction of out-of-plane vibration component due to the third groove part and the fourth groove part is opposite to the direction of out-of-plane vibration component due to the first groove part and the second groove part.

As a result, in the piezoelectric resonator element, the out-of-plane vibration component due to the first groove part and the second groove part and the out-of-plane vibration component due to the third groove part and the fourth groove part are cancelled each other out, and thus, as a whole, the vibration direction of the flexing vibration comes closer to the direction along the one principal surface as the specified vibration direction.

Thereby, in the piezoelectric resonator element, the loss of vibration energy is suppressed, and the efficiency of the flexing vibration is improved.

Further, as another aspect, a resonator element includes a base part, and a resonating arm part that extends from the base part in a first direction and performs flexing vibration, wherein the resonating arm part has one principal surface and the other principal surface opposed to the one principal surface, a first groove part provided along the first direction of the resonating arm part on the one principal surface, a second groove part provided in juxtaposition with the first groove part in a second direction orthogonal to the first direction in a plan view on the other principal surface, a third groove part provided in juxtaposition with the first groove part in the first direction in the plan view and provided nearer the base part side than the first groove part on the other principal surface, and a fourth groove part provided in juxtaposition with the second groove part in the first direction in the plan view and provided nearer the base part side than the second groove part on the one principal surface, and wherein a sum of a depth of the first groove part and a depth of the second groove part and a sum of a depth of the third groove part and a depth of the fourth groove part are larger than a distance between the one principal surface and the other principal surface.

According to the configuration, the resonator element has the first groove part on the one principal surface and the second groove part provided in juxtaposition with the first groove part in the second direction on the other principal surface. Further, the resonator element has the third groove part provided in juxtaposition with the first groove part in the first direction nearer the base part than the first groove part on the other principal surface, and the fourth groove part provided in juxtaposition with the second groove part in the first direction nearer the base part than the second groove part on the one principal surface.

Further, in the resonator element, the sum of the depth of the first groove part and the depth of the second groove part and the sum of the depth of the third groove part and the depth of the fourth groove part are larger than the distance between the one principal surface and the other principal surface.

Thereby, in the resonator element, for example, compared to the case where groove parts having H-shaped sections are provided in the resonating arm part as in related art, the distance of heat transfer from one of the pair of contracting and expanding surfaces as a contracting surface in the flexing vibration to the other of the pair of contracting and expanding surfaces as an expanding surface is longer, and thus, the relaxation time until the temperature equilibration is achieved becomes longer.

As a result, regarding the resonator element, the frequency of the relaxation oscillation is made farther from the frequency of the original flexing vibration, and the reduction of the Q factor due to thermoelastic loss can be suppressed. Therefore, the resonator element can be further downsized.

Now, in the resonator element, the sectional shape containing the first groove part and the second groove part cut along the surface orthogonal to the one principal surface of the resonating arm part and orthogonal to the first direction passes through the middle point of the straight line connecting the one principal surface and the other principal surface, and is not a line-symmetric shape with respect to a center line between the one principal surface and the other principal surface as a line along the one principal surface (other principal surface) as an axis of symmetry.

Thereby, under the condition, in the resonator element, mass imbalance is generated in the resonating arm part, and the flexing vibration is vibration formed by synthesizing the original flexing vibration component along the one principal surface and the out-of-plane vibration component vibrating in the thickness direction as a direction connecting the one principal surface and the other principal surface.

As a result, in the resonator element, the vibration direction of the flexing vibration is no longer along the specified vibration direction, and the loss of vibration energy is generated and the efficiency of the flexing vibration becomes lower.

On the other hand, in the resonator element, the sectional shape containing the third groove part and the fourth groove part cut along the surface orthogonal to the one principal surface of the resonating arm part and orthogonal to the first direction is a shape formed by inverting the sectional shape containing the first groove part and the second groove part, and the flexing vibration is vibration formed by synthesizing the original flexing vibration component along the one principal surface and the out-of-plane vibration component vibrating in the thickness direction as in the case described above.

In this regard, in the resonator element, the sectional shape containing the third groove part and the fourth groove part is the shape formed by inverting the sectional shape containing the first groove part and the second groove part, and thus, the direction of out-of-plane vibration component due to the third groove part and the fourth groove part is opposite to the direction of out-of-plane vibration component due to the first groove part and the second groove part.

As a result, in the resonator element, the out-of-plane vibration component due to the first groove part and the second groove part and the out-of-plane vibration component due to the third groove part and the fourth groove part are cancelled each other out, and thus, as a whole, the vibration direction of the flexing vibration comes closer to the direction along one principal surface as the specified vibration direction.

Thereby, in the resonator element, the loss of vibration energy is suppressed, and the efficiency of the flexing vibration is improved.

Application Example 2

In the resonator element according to the application example, it is preferable that, given that lengths of the first groove part and the second groove part in the first direction are RS and lengths of the third groove part and the fourth groove part in the first direction are S, S:RS=1:(2.2 to 2.8).

According to the configuration, in the resonator element, S:RS=1:(2.2 to 2.8), and thus, the out-of-plane vibration component due to the first groove part and the second groove part and the out-of-plane vibration component due to the third groove part and the fourth groove part are almost cancelled each other out.

As a result, in the resonator element, the loss of vibration energy is further suppressed and the efficiency of the flexing vibration is further improved.

Note that S:RS=1:(2.2 to 2.8) is a finding derived by the inventors through simulations and experiments.

Application Example 3

In the resonator element according to the application example 1, it is preferable that, given that lengths of the first groove part and the second groove part in the first direction are RS, lengths of the third groove part and the fourth groove part in the first direction are S, and a length from a base to a distal end of the resonating arm part is A and a sum of RS and S is L, $8.8992 \times (L/A)^2 - 3.3784 \times (L/A) + 1.746 \leq RS/S \leq 1.3102 \times (L/A)^2 + 3.3784 \times (L/A) + 0.854$.

According to the configuration, in the resonator element, $8.8992 \times (L/A)^2 - 3.3784 \times (L/A) + 1.746 \leq RS/S \leq 1.3102 \times (L/A)^2 + 3.3784 \times (L/A) + 0.854$, and thus, the out-of-plane vibration component due to the first groove part and the second groove part and the out-of-plane vibration component due to the third groove part and the fourth groove part are almost cancelled each other out.

As a result, in the resonator element, the loss of vibration energy is further suppressed and the efficiency of the flexing vibration is further improved.

Note that $8.8992 \times (L/A)^2 - 3.3784 \times (L/A) + 1.746 \leq RS/S \leq 1.3102 \times (L/A)^2 + 3.3784 \times (L/A) + 0.854$ is a finding derived by the inventors through simulations and experiments.

Application Example 4

In the resonator element according to the application example 3, it is preferable that $RS/S = 5.1047 \times (L/A)^2 - 9 \times 10^{-14} \times (L/A) + 1.3$.

According to the configuration, in the resonator element, $RS/S = 5.1047 \times (L/A)^2 - 9 \times 10^{-14} \times (L/A) + 1.3$, and thus, the out-of-plane vibration component due to the first groove part and the second groove part and the out-of-plane vibration component due to the third groove part and the fourth groove part are almost entirely cancelled each other out.

As a result, in the resonator element, the loss of vibration energy is further suppressed and the efficiency of the flexing vibration is further improved.

Note that $RS/S = 5.1047 \times (L/A)^2 - 9 \times 10^{-14} \times (L/A) + 1.3$ is a finding derived by the inventors through simulations and experiments.

Application Example 5

In the resonator element according to the above application example, it is preferable that the resonator element contains quartz.

According to the configuration, the resonator element contains quartz, and thus, a resonator element having advantageous characteristics of frequency-temperature characteristics, processing accuracy, etc. can be provided because of properties of quartz.

Application Example 6

A resonator according to this application example is a resonator using the resonator element according to any one of the application examples 1 to 5, and includes the resonator element, and a package housing the resonator element.

According to the configuration, in the resonator, the resonator element according to any one of the application examples 1 to 5 is housed in the package, and thus, a resonator that exerts the effect described in any one of the application examples may be provided.

Application Example 7

An oscillator according to this application example is an oscillator using the resonator element according to any one of the application examples 1 to 5, and includes the resonator element, and a circuit device that drives the resonator element.

According to the configuration, the oscillator includes the resonator element according to any one of the application examples 1 to 5 and the circuit device, and thus, an oscillator that exerts the effect described in any one of the application examples may be provided.

Application Example 8

An electronic apparatus according to this application example uses the resonator element according to any one of the application examples 1 to 5.

According to the configuration, the electronic apparatus includes the resonator element according to any one of the application examples 1 to 5, and thus, an electronic apparatus that exerts the effect described in any one of the application examples 1 to 5 may be provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments implementing the invention will be described with reference to the drawings.

In the first embodiment, a quartz resonator element including quartz as a kind of a piezoelectric material as a resonator element will be explained as an example. Further, in the second embodiment, the third embodiment, and the fourth embodiment, a quartz resonator, a quartz oscillator, and a cellular phone will be explained as examples as a resonator, an oscillator, and an electronic apparatus using the quartz resonator element.

Furthermore, in the following embodiments (except the fourth embodiment), explanation will be made by referring to an X-axis, a Y-axis, and a Z-axis, and the respective axes show a crystal X-axis as an electric axis, a crystal Y-axis as a mechanical axis, and a crystal Z-axis as an optical axis as crystal axes of the quartz.

In addition, in the following embodiments, the Z-axis shown in the drawing may be inclined at 1 degree to 5 degrees relative to the crystal Z-axis, and the plane defined by the Z-axis and the X-axis may be formed at a tilt due to the inclination.

First Embodiment

Figure 1:
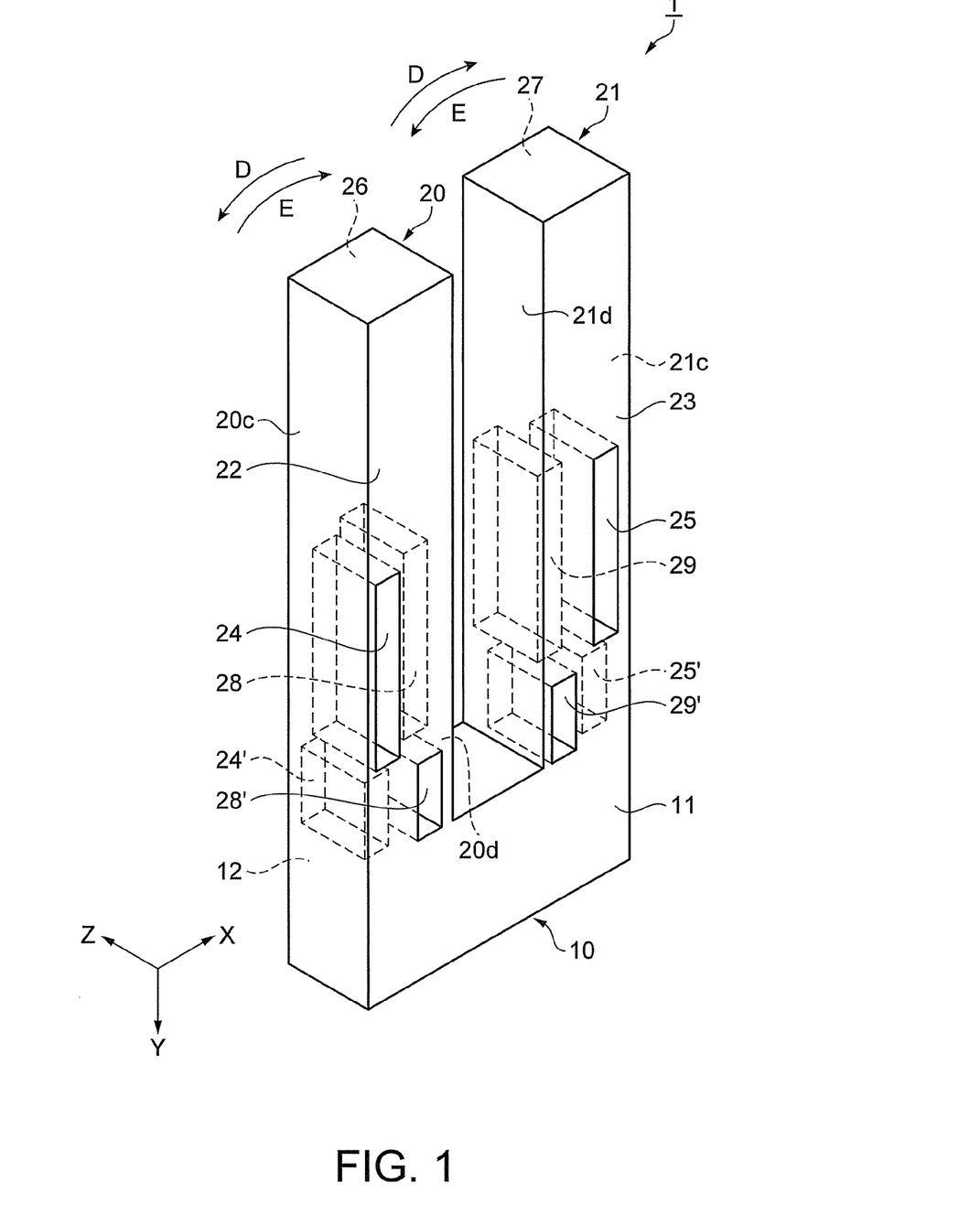
FIG. 1 is a schematic perspective view showing an outline configuration of a quartz resonator element of the first embodiment.
Figure 2:
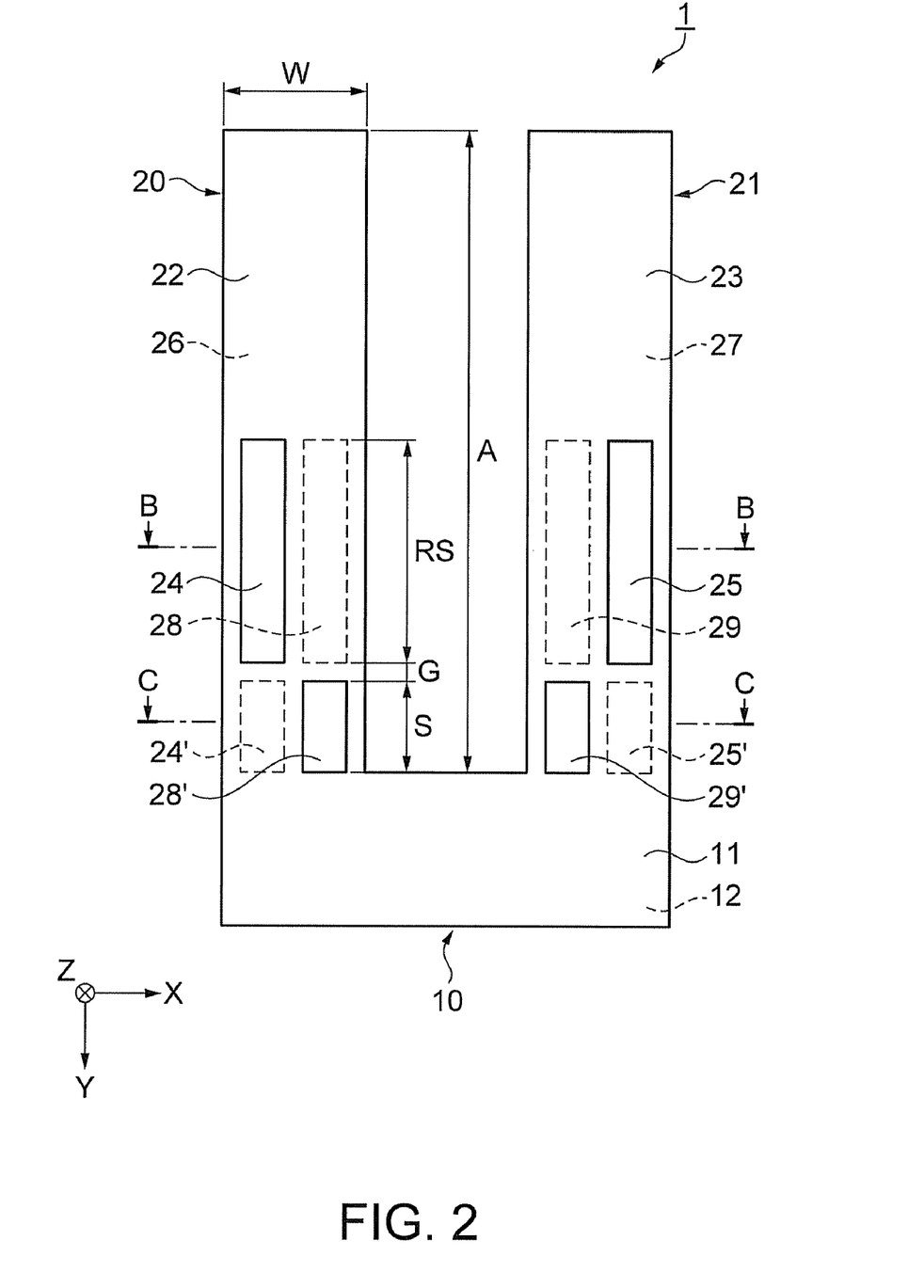
FIG. 2 is a schematic plan view of FIG. 1.
Figure 3A:
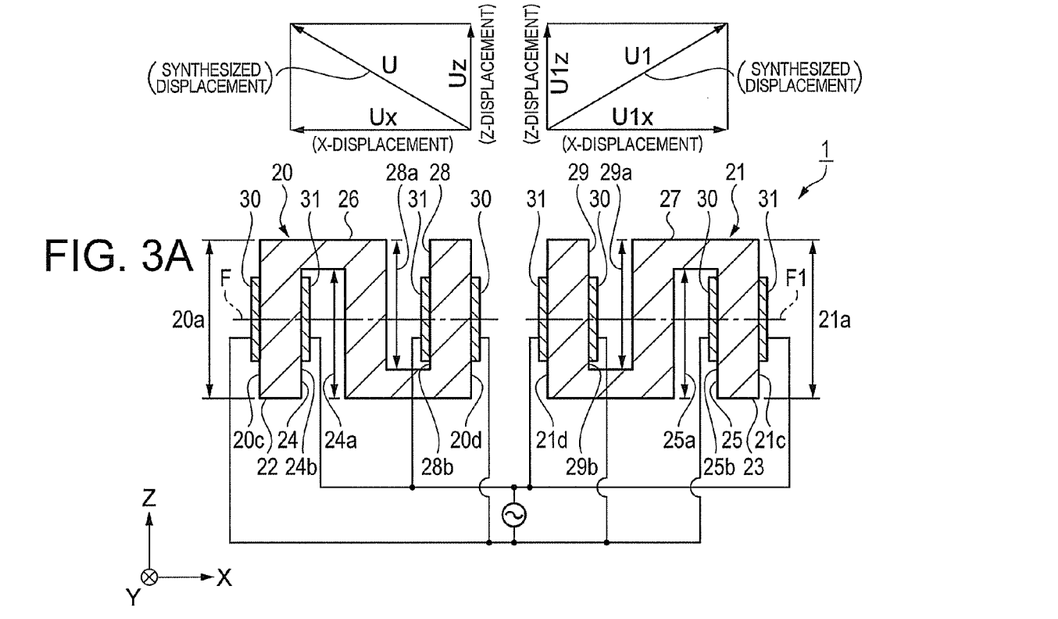
FIG. 3A is a sectional view along B-B line of FIG. 2 and wiring diagram.
Figure 3B:
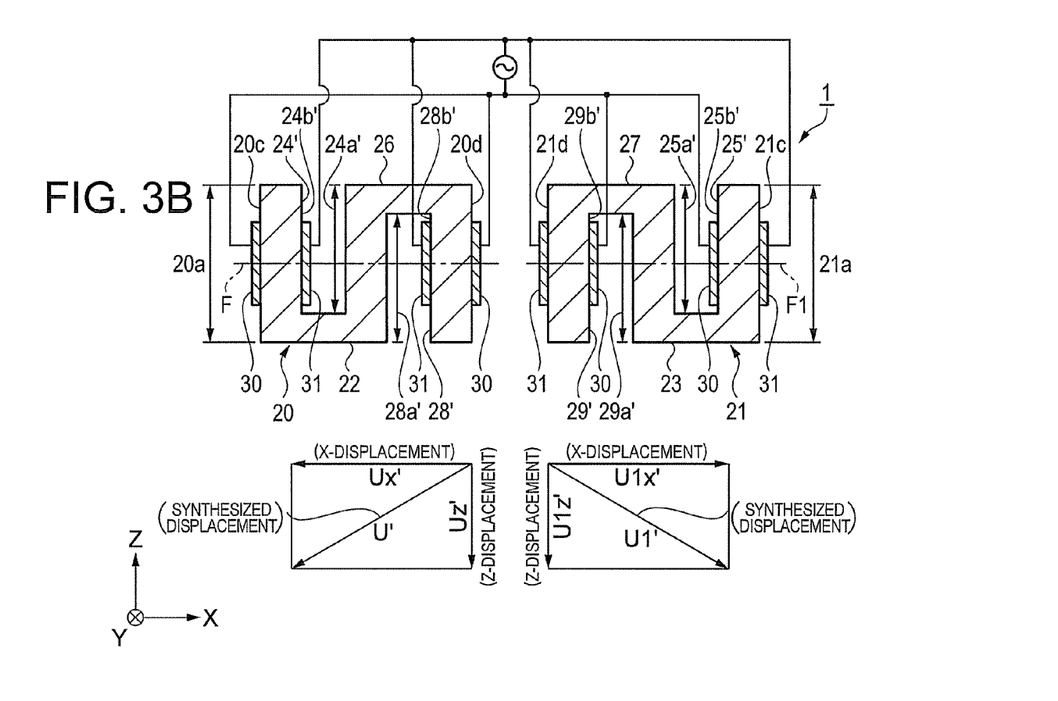
FIG. 3B is a sectional view along C-C line of FIG. 2 and wiring diagram.

FIG. 1 is a schematic perspective view showing an outline configuration of a quartz resonator element of the first embodiment. FIG. 2 is a schematic plan view of FIG. 1. FIGS. 3A and 3B are schematic sectional views of FIG. 2, and FIG. 3A is a sectional view along B-B line of FIG. 2 and wiring diagram and FIG. 3B is a sectional view along C-C line of FIG. 2 and wiring diagram. Note that, in FIGS. 1 and 2, electrodes and the like are omitted for convenience.

As shown in FIGS. 1 and 2, a quartz resonator element 1 includes a base part 10, and a pair of resonating arm parts 20, 21 extending from the base part 10 in a first direction (Y-axis direction) and performs flexing vibration.

The quartz resonator element 1 forms a tuning fork with the base part 10 and the pair of resonating arm parts 20, 21.

The pair of resonating arm parts 20, 21 are formed in rectangular column shapes, and extend in parallel with each other from one end side of the base part 10 in the Y-axis direction (first direction).

Note that the base part 10 and the resonating arm parts 20, 21 are cut out from a quartz raw stone or the like, then, ground into a flat plate shape having a predetermined thickness, and formed in an independent tuning fork shape by etching or the like.

The resonating arm parts 20, 21 have one principal surfaces 22, 23 along the X-axis direction as a specified vibration direction of the flexing vibration, other principal surfaces 26, 27 facing the one principal surfaces 22, 23 along the X-axis direction, one surfaces 20c, 21c and other surfaces 20d, 21d as pairs of expanding and contracting surfaces that intersect with the X-axis direction and alternately expand and contract due to the flexing vibration.

The resonating arm parts 20, 21 have first groove parts 24, 25 provided on the one principal surfaces 22, 23 along the extension direction (first direction) of the resonating arm parts 20, 21, and have second groove parts 28, 29 provided on the other principal surfaces 26, 27 along the second direction (X-axis direction) orthogonal to the first direction in a plan view in juxtaposition with the first groove parts 24, 25.

Further, the resonating arm parts 20, 21 have third groove parts 24', 25' provided on the other principal surfaces 26, 27 along the first direction in the plan view in juxtaposition with the first groove parts 24, 25 and provided nearer the base part 10 side than the first groove parts 24, 25, and have fourth groove parts 28', 29' provided on the one principal surfaces 22, 23 along the first direction in the plan view in juxtaposition with the second groove parts 28, 29 and provided nearer the base part 10 side than the second groove parts 28, 29.

Note that the one principal surfaces 22, 23 of the resonating arm parts 20, 21 are integrated with one principal surface 11 of the base part 10 and the other principal surfaces 26, 27 are integrated with the other principal surface 12 of the base part 10.

The third groove parts 24', 25' and the fourth groove parts 28', 29' are provided from the bases toward the distal ends of the resonating arm parts 20, 21.

Further, as shown in FIG. 2, a predetermined gap G is provided between the third groove parts 24', 25' and the fourth groove parts 28', 29' and the first groove parts 24, and the second groove parts 28, 29.

As shown in FIG. 2, in the quartz resonator element 1, given that the lengths of the first groove parts 24, 25 and the second groove parts 28, 29 in the extension direction (first direction) are RS and the lengths of the third groove parts 24', 25' and the fourth groove parts 28', 29' in the extension direction (first direction) are S, it is preferable that S:RS=1:(2.2 to 2.8), and more preferable that S:RS=1:2.5 (details will be described later).

Further, in the quartz resonator element 1, given that the lengths from the bases to the distal ends of the resonating arm parts 20, 21 are A and the sum of RS and S is L, it is preferable that $8.8992 \times (L/A)^2 - 3.3784 \times (L/A) + 1.746 \leq RS/S \leq 1.3102 \times (L/A)^2 + 3.3784 \times (L/A) + 0.854$, and more preferable that $RS/S = 5.1047 \times (L/A)^2 - 9 \times 10^{-14} \times (L/A) + 1.3$ (details will be described later).

As shown in FIGS. 3A and 3B, the first groove parts 24, 25 and the second groove parts 28, 29 and the third groove parts 24', 25' and the fourth groove parts 28', 29' are formed to have nearly rectangular sectional shapes so that the sums of the depths 24a, 25a of the first groove parts 24, 25 and the depths 28a, 29a of the second groove parts 28, 29 and the sums of the depths 24a', 25a' of the third groove parts 24', 25' and the depths 28a' and 29a' of the fourth groove parts 28', 29' may be larger than distances 20a, 21a between the one principal surfaces 22, 23 and the other principal surfaces 26, 27 ((24a+28a)>20a, (25a+29a)>21a, (24a'+28a')>20a, (25a'+29a')>21a).

Note that the first groove parts 24, 25 and the second groove parts 28, 29 and the third groove parts 24', 25' and the fourth groove parts 28', 29' are formed by etching, sandblasting, or the like.

As shown in FIGS. 3A and 3B, on the side walls as outer sides of the first groove parts 24, 25 and the second groove parts 28, 29 and the third groove parts 24', 25' and the fourth groove parts 28', 29', excitation electrodes 30, 31 are provided.

Specifically, in the resonating arm part 20, the excitation electrodes 30 are provided on one surface 20c connecting the one principal surface 22 and the other principal surface 26 and the other surface 20d connecting the one principal surface 22 and the other principal surface 26.

Further, the excitation electrodes 31 are provided on a surface 24b at the one surface 20c side in the first groove part 24, a surface 28b at the other surface 20d side in the second groove part 28, a surface 24b' at the one surface 20c side in the third groove part 24', and a surface 28b' at the other surface 20d side in the fourth groove part 28'.

On the other hand, in the resonating arm part 21, the excitation electrodes 31 are provided on one surface 21c connecting the one principal surface 23 and the other principal surface 27 and the other surface 21d connecting the one principal surface 23 and the other principal surface 27.

Further, the excitation electrodes 30 are provided on a surface 25b at the one surface 21c side in the first groove part 25, a surface 29b at the other surface 21d side in the second groove part 29, a surface 25b' at the one surface 21c side in the third groove part 25', and a surface 29b' at the other surface 21d side in the fourth groove part 29'.

The excitation electrodes 30 are connected to each other and respectively extracted to the base part 10 by extraction electrodes (not shown) and connected to fixed electrodes (not shown) as well as the excitation electrodes 31.

Alternating-current charge is applied between the excitation electrodes 30 and the excitation electrodes 31.

Note that the excitation electrodes 30, 31 include foundation layers of Cr, Ni, or the like and electrode layers of Au, Ag, or the like. The respective layers are formed by deposition, sputtering, or the like.

Here, the operation of the quartz resonator element 1 will be explained.

When alternating-current charge is applied between the excitation electrodes 30, 31 as drive signals, the resonating arm parts 20, 21 of the quartz resonator element 1 perform flexing vibration that alternately displaces in directions of arrows D and in directions of arrows E nearly along the X-axis direction as shown in FIG. 1.

Specifically, when positive charge is applied to the excitation electrodes 30 and negative charge is applied to the excitation electrodes 31, the one surfaces 20c, 21c contract in the Y-axis direction and the other surfaces 20d, 21d expand in the Y-axis direction. Thereby, the resonating arm parts 20, 21 displace in the directions of the arrows D.

On the other hand, when negative charge is applied to the excitation electrodes 30 and positive charge is applied to the excitation electrodes 31, the one surfaces 20c, 21c expand in the Y-axis direction and the other surfaces 20d, 21d contract in the Y-axis direction. Thereby, the resonating arm parts 20, 21 displace in the directions of the arrows E.

The resonating arm parts 20, 21 of the quartz resonator element 1 alternately repeat displacement in the directions of the arrows D and in the directions of the arrows E, and thereby, the one surfaces 20c, 21c and the other surfaces 20d, 21d alternately expand and contract.

In this regard, as shown in FIG. 3A, because of the sectional shapes in which the first groove parts 24, 25 and the second groove parts 28, 29 of the resonating arm parts 20, 21 are formed ((24a+28a)>20a, (25a+29a)>21a), the distances of heat transfer from the one surfaces 20c, 21c to the other surfaces 20d, 21d, which alternately repeat expansion and contraction with the flexing vibration, are longer compared to the case where groove parts having H-shaped sections are provided as in related art.

Specifically, the distances of heat transfer are a distance from one end at the opening side of the first groove part 24 of the one surface 20c along the sectional shape to one end at the opening side of the second groove part 28 of the other surface 20d in the resonating arm part 20, and a distance from one end at the opening side of the first groove part 25 of the one surface 21c along the sectional shape to one end at the opening side of the second groove part 29 of the other surface 21d in the resonating arm part 21.

Similarly, as shown in FIG. 3B, because of the sectional shapes in which the third groove parts 24', 25' and the fourth groove parts 28', 29' of the resonating arm parts 20, 21 are formed ((24a'+28a')>20a, (25a'+29a')>21a), the distances of heat transfer from the one surfaces 20c, 21c to the other surfaces 20d, 21d, which alternately repeat expansion and contraction with the flexing vibration, are longer compared to the case where groove parts having H-shaped sections are provided as in related art.

Here, the frequency $f_0$ and the relaxation time $\tau$ of the above described relaxation oscillation are expressed by $f_0=1/(2\pi\tau)$.

Regarding the quartz resonator element 1, the distance of heat transfer is longer than that in related art (H-shaped groove part), and the relaxation time $\tau$ until the temperature equilibration is achieved is longer than that in related art (H-shaped groove part). As a result, regarding the quartz resonator element 1, the frequency of the relaxation oscillation (relaxation oscillation frequency) $f_0$ is far from the frequency f of the original flexing vibration.

Generally, it is known that the relaxation oscillation frequency (thermal relaxation frequency) $f_0$ is obtained by the following equation.

$$f_0=\pi k/(2\rho C p a^2) \quad (1)$$

Here, $\pi$ is the ratio of the circumference of a circle to its diameter, k is a coefficient of thermal conductivity of the resonating arm part in the vibration direction (flexing vibration direction), $\rho$ is mass density of the resonating arm part, Cp is heat capacity of the resonating arm part, and a is a width of the resonating arm part in the vibration direction (flexing vibration direction).

In the case where the coefficient of thermal conductivity k, the mass density $\rho$, the heat capacity Cp of the equation (1) are substituted by the constants of the materials themselves of the resonating arm part, the relaxation oscillation frequency $f_0$ to be obtained is a relaxation oscillation frequency of the resonating arm part when no groove part is provided.

Figure 4:
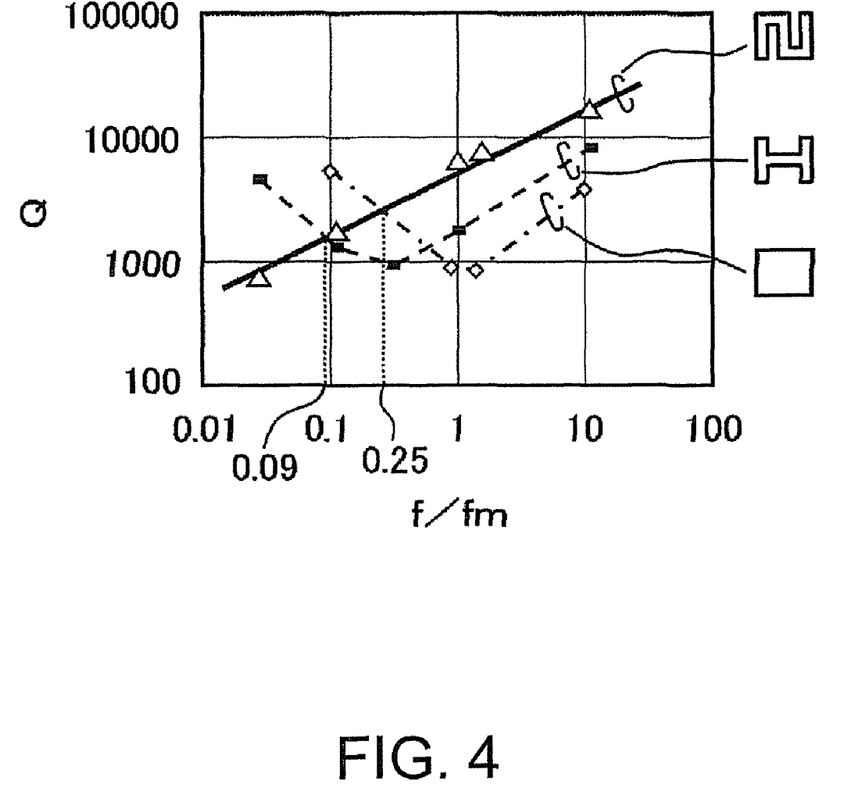
FIG. 4 is a graph showing f/fm-dependency of Q factor of a flexing resonator element.

FIG. 4 is a graph showing f/fm-dependency of Q factor of the flexing resonator element (quartz resonator element). Here, fm is the relaxation oscillation frequency when no groove part is provided in the resonating arm part (when the sectional shape of the resonating arm part is a nearly rectangular shape). The graphics on the right of the graph in FIG. 4 schematically show the sectional shapes of the resonating arm part.

In FIG. 4, the triangle markers form a plot in the case of the sectional shape of the resonating arm part shown in FIGS. 3A and 3B, the black square markers form a plot in the H-shaped case where the sectional shape of the resonating arm part is formed in "H" by providing groove parts on both principal surfaces of the resonating arm part, and white diamond markers form a plot in the case of a flat plate when no groove part is provided in either of the principal surfaces of the resonating arm part. Further, the thick solid line is an approximate line of the values of the triangle markers, the broken line is an interpolation line of the values of the square markers, and the dashed-dotted line is an interpolation line of the values of the diamond markers.

As shown in FIG. 4, it becomes clear that, in the flexing resonator element, if the sectional shape of the resonating arm part is formed in the shape shown in FIGS. 3A and 3B and f/fm is a value larger than 0.09, the Q factor higher than that in the case of the H-shape is obtained.

Further, in the above described flexing resonator element (corresponding to the quartz resonator element 1), if f/fm is a value larger than 0.25, the Q factor higher than those in both cases of the H-shape and the flat plate may be obtained, and, if f/fm is a value larger than "1", the Q factor significantly higher than those in both cases of the H-shape and the flat plate may be obtained.

Now, in the quartz resonator element 1, as shown in FIG. 3A, the sectional shapes containing the first groove parts 24, 25 and the second groove parts 28, 29 cut along the surface orthogonal to the one principal surfaces 22, 23 of the resonating arm parts 20, 21 and orthogonal to the extension direction (first direction) of the resonating arm parts 20, 21 pass through the middle points of the straight lines connecting the one principal surfaces 22, 23 and the other principal surfaces 26, 27, and are not line-symmetric shapes with respect to center lines F, F1 between the one principal surfaces 22, 23 and the other principal surfaces 26, 27 as lines along the one principal surfaces 22, 23 (other principal surfaces 26, 27) as the axes of symmetry.

Thereby, under the condition, in the quartz resonator element 1, mass imbalance is generated in the resonating arm parts 20, 21, and, as shown in FIG. 3A, the displacement U of the flexing vibration of the resonating arm part 20 becomes a displacement formed by synthesizing the displacement component Ux of the original flexing vibration vibrating in the X-axis direction along the one principal surfaces 22, 23 (other principal surfaces 26, 27) and the displacement component Uz of out-of-plane vibration vibrating in the Z-axis direction as a direction connecting the one principal surfaces 22, 23 and the other principal surfaces 26, 27 by the moment in the Z-axis direction.

On the other hand, the displacement U1 of the flexing vibration of the resonating arm part 21 becomes a displacement formed by synthesizing the displacement component U1x of the original flexing vibration vibrating in the X-axis direction and the displacement component U1z of out-of-plane vibration vibrating in the Z-axis direction by the moment in the Z-axis direction.

In this regard, the displacement component Uz and the displacement component U1z are displacement components in the same direction.

As a result, in the quartz resonator element 1, the directions of the displacements U, U1 of the flexing vibration are no longer along the one principal surfaces 22, 23 (no longer along the X-axis direction), and thus, the loss of vibration energy may be generated and the efficiency of the flexing vibration may become lower.

Note that, in FIG. 3A, the displacements U, U1 in one direction of the flexing vibration (corresponding to the directions of arrows D in FIG. 1) are shown for convenience, however, the same is applicable to the displacements in the opposite direction (corresponding to the directions of arrows E in FIG. 1).

On the other hand, in the quartz resonator element 1, as shown in FIG. 3B, the sectional shapes containing the third groove parts 24', 25' and the fourth groove parts 28', 29' cut along the surface orthogonal to the one principal surfaces 22, 23 of the resonating arm parts 20, 21 and orthogonal to the extension direction (first direction) of the resonating arm parts 20, 21 are shapes formed by inverting the sectional shapes containing the first groove parts 24, 25 and the second groove parts 28, 29.

Thereby, in the quartz resonator element 1, in the third groove parts 24', 25' and the fourth groove parts 28', 29', the displacements U', U1' of the flexing vibration become displacements formed by synthesizing the displacement components Ux', U1x' of the original flexing vibration along the one principal surfaces 22, 23 and the displacement components Uz', U1z' of out-of-plane vibration vibrating in the Z-axis direction as in the case described above.

In this regard, in the quartz resonator element 1, the sectional shapes containing the third groove parts 24', 25' and the fourth groove parts 28', 29' are shapes formed by inverting the sectional shapes containing the first groove parts 24, 25 and the second groove parts 28, 29, and thus, the directions of the displacement components Uz', U1z' of out-of-plane vibration in the third groove parts 24', 25' and the fourth groove parts 28', 29' are opposite to the directions of the displacement components Uz, U1z of out-of-plane vibration in the first groove parts 24, 25 and the second groove parts 28, 29.

As a result, in the quartz resonator element 1, the displacement components Uz, U1z of out-of-plane vibration in the first groove parts 24, 25 and the second groove parts 28, 29 and the displacement components Uz', U1z' of out-of-plane vibration in the third groove parts 24', 25' and the fourth groove parts 28', 29' are cancelled each other out, and thus, as a whole, the directions of the displacements of the flexing vibration come closer to the X-axis direction (the directions along one principal surfaces) as the specified vibration direction.

Thereby, in the quartz resonator element 1, the moment in the Z-direction decreases and the loss of vibration energy is suppressed, and the efficiency of the flexing vibration is improved.

The above description will be further explained based on specific data.

Figure 5:
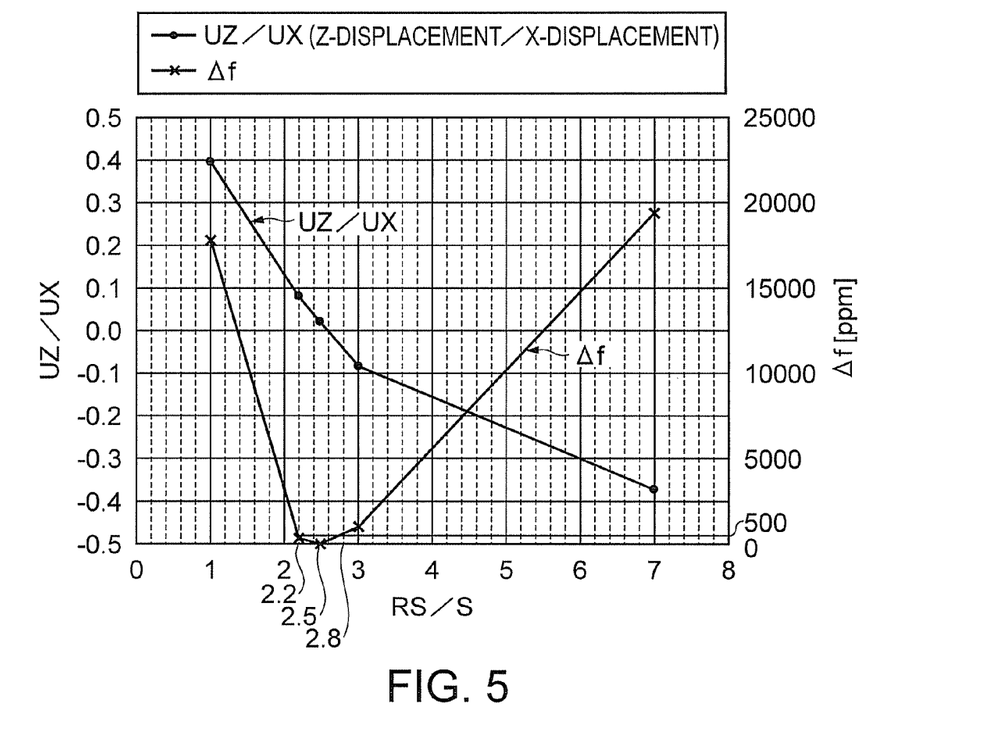
FIG. 5 is a graph showing a correlation between RS/S and UZ/UX (Z-displacement/X-displacement).

FIG. 5 is a graph showing a correlation between a ratio of lengths RS of the first groove parts 24, 25 and the second groove parts 28, 29 in the extension direction to the lengths S of the third groove parts 24', 25' and the fourth groove parts 28', 29' in the extension direction (hereinafter, may simply be referred to as RS/S) and a ratio of the displacement component UZ of out-of-plane vibration (vibration in the Z-axis direction) in the flexing vibration of the quartz resonator element 1 as a whole to the displacement component UX in the X-axis direction as the originally specified vibration direction (hereinafter, may simply be referred to as UZ/UX).

Figure 6:
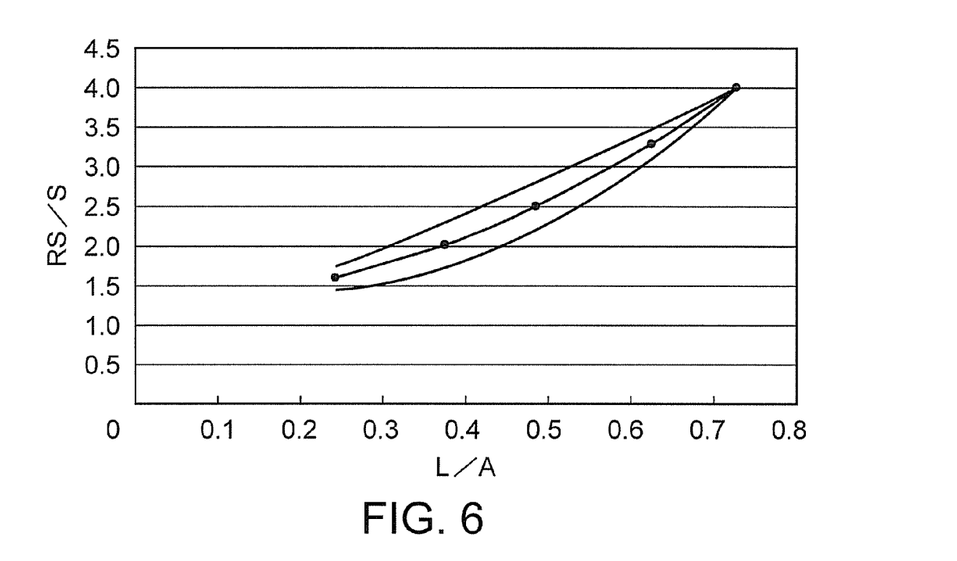
FIG. 6 is a graph showing a correlation between L/A and RS/S.

FIG. 6 is a graph showing a correlation between a ratio of the sums L (RS+S) of the lengths of the respective groove parts at the distal end side and the base part side of the resonating arm parts 20, 21 to the lengths A from the bases to the distal ends of the resonating arm parts 20, 21 (hereinafter, may simply be referred to as L/A) and RS/S with which the loss of vibration energy is within an allowable range.

FIGS. 5 and 6 are based on data derived by the inventors through simulations and experiments.

As shown in FIG. 5, regarding the quartz resonator element 1, when RS/S=2.2 to 2.8, i.e., S:RS=1:(2.2 to 2.8), UZ/UX becomes smaller, and a value of vibration leakage Δf (a shift amount between the frequency when the base part 10 is hung with wires or fixed with a soft conducting adhesive and the frequency when the base part 10 is fixed with solder or a hard conducting adhesive) as one scale of the loss of vibration energy in the flexing vibration becomes smaller. Specifically, the vibration leakage Δf becomes about 500 ppm or less at the appropriate level for mass production.

Further, regarding the quartz resonator element 1, when RS/S=2.5, i.e., S:RS=1:2.5, UZ/UX becomes nearly zero, and the value of the vibration leakage Δf becomes the minimum (nearly 0 ppm).

The negative sign of UZ/UX shows that the displacement direction of out-of-plane vibration becomes opposite (from the positive direction of the Z-axis to the negative direction of the Z-axis).

As shown in FIG. 6, regarding the quartz resonator element 1, when $8.8992\times(L/A)^2-3.3784\times(L/A)+1.746$ (the lowermost line in the drawing)$\leq RS/S \leq 1.3102\times(L/A)^2+3.3784\times(L/A)+0.854$ (the uppermost line in the drawing), UZ/UX becomes smaller, and the value of the vibration leakage $\Delta f$ becomes smaller. Specifically, the leakage becomes about 500 ppm or less at the appropriate level for mass production.

Furthermore, regarding the quartz resonator element 1, when $RS/S=5.1047\times(L/A)^2-9\times10^{-24}\times(L/A)+1.3$ (the center line in the drawing), UZ/UX becomes nearly zero, and the value of the vibration leakage $\Delta f$ becomes the minimum (nearly 0 ppm).

Note that, in the simulations and the experiments, using samples having the lengths A=about 1650 μm from the bases to the distal ends of the resonating arm parts 20, 21 and the widths W=about 100 μm of the resonating arm parts 20, 21 in the X-axis direction, they are fixed at a gap G=about 20 μm, the values of RS, S, L are appropriately set in ranges of RS=about 200 μm to about 1100 μm, S=about 100 μm to about 600 μm, and L=about 400 μm to about 1200 μm, and evaluations are made.

As described above, in the quartz resonator element 1 of the first embodiment, the sums of the depths 24a, 25a of the first groove parts 24, 25 and the depths 28a, 29a of the second groove parts 28, 29 and the sums of the depths 24a', 25a' of the third groove parts 24', 25' and the depths 28a' and 29a' of the fourth groove parts 28', 29' are larger than distances 20a, 21a between the one principal surfaces 22, 23 and the other principal surfaces 26, 27 ((24a+28a)>20a, (25a+29a)>21a, (24a'+28a')>20a, (25a'+29a')>21a).

Thereby, in the quartz resonator element 1, the distances of heat transfer from the contracting surfaces to the expanding surfaces (the distances of heat transfer from the one surfaces 20c, 21c to the other surfaces 20d, 21d) in the flexing vibration are longer compared to the case where groove parts having H-shaped sections are provided as in related art in the resonating arm parts 20, 21, for example, and thus, the relaxation time $\tau$ until the temperature equilibration is achieved becomes longer.

As a result, regarding the quartz resonator element 1, the relaxation oscillation frequency $f_0$ is made farther from the frequency f of the original flexing vibration, and the reduction of the Q factor due to thermoelastic loss can be suppressed. Therefore, the quartz resonator element 1 can be further downsized.

Further, in the quartz resonator element 1, the sectional shapes containing the third groove parts 24', 25' and the fourth groove parts 28', 29' cut along the surface orthogonal to the one principal surfaces 22, 23 of the resonating arm parts 20, 21 and orthogonal to the extension direction (first direction) of the resonating arm parts 20, are shapes formed by inverting the sectional shapes containing the first groove parts 24, 25 and the second groove parts 28, 29 cut in the similar manner.

Thereby, in the quartz resonator element 1, the directions of the displacement components Uz, U1z of out-of-plane vibration due to the first groove parts 24, 25 and the second groove parts 28, 29 in the flexing vibration and the directions of the displacement components Uz', U1z' of out-of-plane vibration due to the third groove parts 24', 25' and the fourth groove parts 28', 29' are opposite.

As a result, in the quartz resonator element 1, the displacement components Uz, U1z of out-of-plane vibration due to the first groove parts 24, 25 and the second groove parts 28, 29 and the displacement components Uz', U1z' of out-of-plane vibration due to the third groove parts 24', 25' and the fourth groove parts 28', 29' are cancelled each other out, and thus, as a whole, the vibration direction of the flexing vibration comes closer to the X-axis direction (the direction along one principal surfaces 22, 23) as the specified vibration direction.

Thereby, in the quartz resonator element 1, the loss of vibration energy in the flexing vibration is suppressed, and thus, the CI (crystal impedance) value or the like becomes lower and the efficiency of the flexing vibration is improved.

Further, regarding the quartz resonator element 1, when S:RS=1:(2.2 to 2.8), the displacement components Uz, U1z of out-of-plane vibration due to the first groove parts 24, 25 and the second groove parts 28, 29 and the displacement components Uz', U1z' of out-of-plane vibration due to the third groove parts 24', 25' and the fourth groove parts 28', 29' are almost cancelled each other out.

As a result, in the quartz resonator element 1, UZ/UX becomes smaller, and the value of the vibration leakage $\Delta f$ as the loss of vibration energy becomes even smaller (about 500 ppm or less) and the efficiency of the flexing vibration is further improved.

Furthermore, regarding the quartz resonator element 1, when S:RS=1:2.5, the displacement components Uz, U1z of out-of-plane vibration due to the first groove parts 24, and the second groove parts 28, 29 and the displacement components Uz', U1z' of out-of-plane vibration due to the third groove parts 24', 25' and the fourth groove parts 28', 29' are almost entirely cancelled each other out.

As a result, in the quartz resonator element 1, the UZ/UX becomes nearly zero, and the value of the vibration leakage $\Delta f$ becomes the minimum (nearly 0 ppm) and the efficiency of the flexing vibration is further improved.

Further, regarding the quartz resonator element 1, when $8.8992\times(L/A)^2-3.3784\times(L/A)+1.746\leq RS/S \leq 1.3102\times(L/A)^2+3.3784\times(L/A)+0.854$, the displacement components Uz, U1z of out-of-plane vibration due to the first groove parts 24, 25 and the second groove parts 28, 29 and the displacement components Uz', U1z' of out-of-plane vibration due to the third groove parts 24', 25' and the fourth groove parts 28', 29' are almost cancelled each other out.

As a result, in the quartz resonator element 1, UZ/UX becomes smaller, and the value of the vibration leakage $\Delta f$ becomes even smaller (about 500 ppm or less), the efficiency of the flexing vibration is further improved.

Furthermore, regarding the quartz resonator element 1, when $RS/S=5.1047\times(L/A)^2-9\times10^{-14}\times(L/A)+1.3$, the displacement components Uz, U1z of out-of-plane vibration due to the first groove parts 24, 25 and the second groove parts 28, 29 and the displacement components Uz', U1z' of out-of-plane vibration due to the third groove parts 24', 25' and the fourth groove parts 28', 29' are further cancelled each other out.

As a result, in the quartz resonator element 1, UZ/UX becomes nearly zero, and the value of the vibration leakage $\Delta f$ becomes the minimum (nearly 0 ppm) and the efficiency of the flexing vibration is further improved.

In addition, since the quartz resonator element 1 contains quarts, it may be provided as a resonator element having advantageous characteristics of frequency-temperature characteristics, aging characteristics of frequency, processing accuracy, etc. because of properties of quartz.

Modified Example

As below, a modified example of the quartz resonator element of the first embodiment will be explained.

Figure 7:
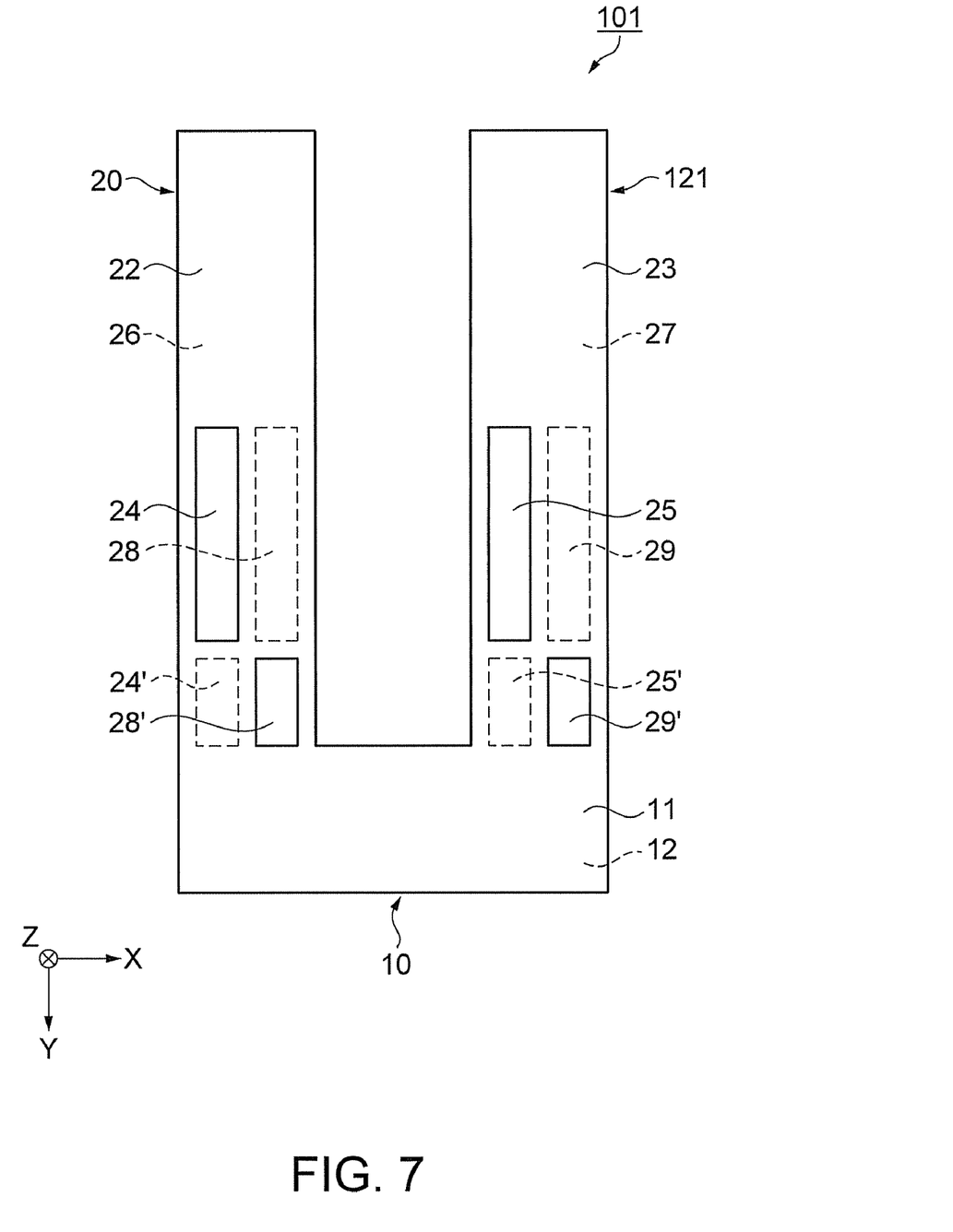
FIG. 7 is a schematic plan view showing a quartz resonator element of a modified example of the first embodiment.

FIG. 7 is a schematic plan view showing a quartz resonator element of a modified example of the first embodiment. The same signs are assigned to the common parts with the first embodiment and their explanation will be omitted, and the parts different from those of the first embodiment will be explained mainly.

As shown in FIG. 7, in a quartz resonator element 101, the arrangement of the first groove part 25 and the second groove part 29 and the third groove part 25', and the fourth groove part 29' in a resonating arm part 121 is reversed compared to the arrange of those of the resonating arm part 21 of the quartz resonator element 1 in the embodiment. In other words, in the quartz resonator element 101, the arrangement of the respective groove parts is the same in the resonating arm part 20 and the resonating arm part 121.

The quartz resonator element 101 may exert the same effect as that of the first embodiment by the same operation as that of the first embodiment in the arrangement.

Note that, in the above described embodiment and modified example, the tuning fork-type quartz resonator element having the pair of resonating arm parts has been explained as an example, however, not limited to that, but, for example, a rod-like quartz resonator element having one resonating arm part or a tuning fork-type quartz resonator element having three or more resonating arm parts may be used.

Second Embodiment

As below, a quartz resonator as a resonator of the second embodiment will be explained as an example.

Figure 8:
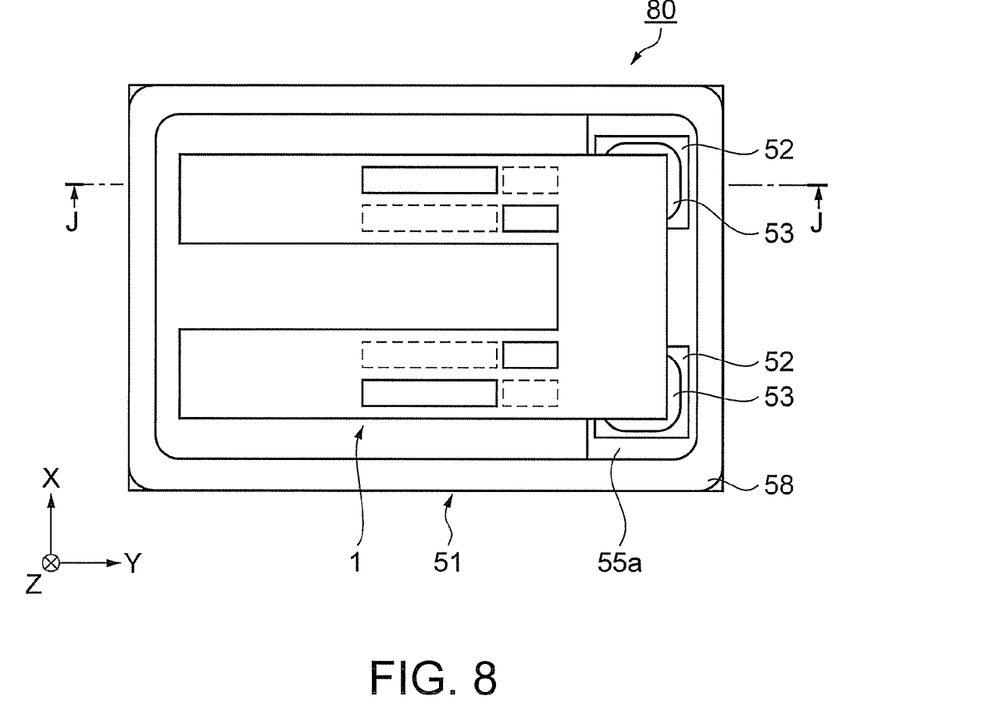
FIG. 8 is a schematic plan view showing an outline configuration of a quartz resonator of the second embodiment.
Figure 9:
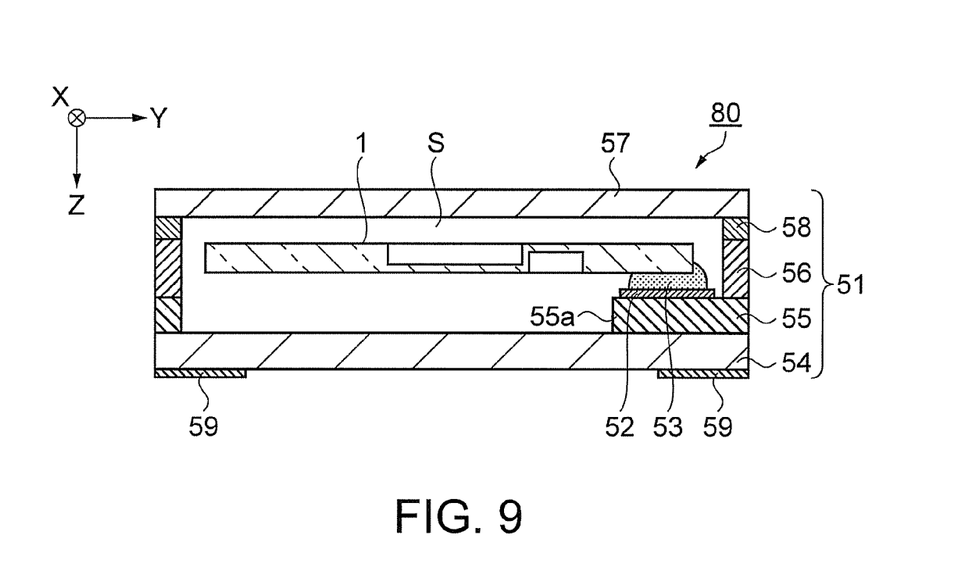
FIG. 9 is a schematic sectional view of FIG. 8.

FIG. 8 is a schematic plan view showing an outline configuration of a quartz resonator of the second embodiment. FIG. 9 is a schematic sectional view along J-J line of FIG. 8. In FIG. 8, a lid body is omitted for convenience.

Further, the same signs are assigned to the common parts with the first embodiment and their explanation will be omitted.

The quartz resonator 80 of the second embodiment is a quartz resonator using the quartz resonator element of the first embodiment or the modified example of the first embodiment. Here, the explanation will be made using the quartz resonator element 1 of the first embodiment.

As shown in FIGS. 8, 9, the quartz resonator 80 houses the quartz resonator element 1 within a package 51. Specifically, the quartz resonator 80 houses the quartz resonator element 1 in an internal space S of the package 51 including a first substrate 54, and a second substrate 55 and a third substrate 56 stacked on the first substrate 54.

The package 51 includes the first substrate 54, the second substrate 55, and the third substrate 56, and further includes a lid body 57. In the package 51, the second substrate 55 has an extension part 55a extended within the package 51, and two electrode parts 52 are formed in the extension part 55a.

In the quartz resonator 80, fixed electrodes (not shown) of the quartz resonator element 1 are fixed to the electrode parts 52 using conducting adhesives 53 or the like, and the excitation electrodes 30, 31 (see FIGS. 3A and 3B) and the electrode parts 52 are electrically connected via the fixed electrodes. As the conducting adhesives 53, materials formed by adding conducting particles such as silver particles to binder components of a predetermined synthetic resin may be used.

The first substrate 54, the second substrate 55, and the third substrate 56 are formed by an insulating material such as ceramic. Specifically, as a preferable material, a material having a linear coefficient of expansion equal or approximate to that of the quartz resonator element 1 or the lid body 57 is selected.

In the embodiment, for example, a green sheet of ceramic is used. The green sheet is obtained, for example, by dispersing ceramic powder in a predetermined solution, adding a binder thereto, shaping the produced kneaded material into an elongated sheet, and cutting this into predetermined lengths.

The first substrate 54, the second substrate 55, and the third substrate 56 may be formed by stacking and sintering the green sheets shaped in the shapes as shown in the drawings. The first substrate 54 forms the bottom part of the package 51 and the second substrate 55 and the third substrate 56 stacked thereon are formed in frame shapes to form the internal space S with the first substrate 54 and the lid body 57.

To the third substrate 56, the lid body 57 formed by ceramic, glass or a metal such as kovar is joined via a joining material 58 such as a kovar ring or low-melting-point glass. Thereby, the internal space S of the package 51 is air-tightly sealed.

On the first substrate 54, the above described electrode parts 52 are formed, for example, by forming a conducting pattern (not shown) using a conducting paste of AG, Pd, or the like or a conducting paste of tungsten metalize or the like, then, sintering the first substrate 54, the second substrate 55, and the third substrate 56, and then, sequentially plating Ni, Au or Ag, etc.

The electrode parts 52 are electrically connected to a mounted terminal 59 formed on the outer bottom surface of the package 51 by the conducting pattern (not shown).

In the quartz resonator 80, by applying a drive signal to the mounted terminal 59, alternating-current charge is applied between the excitation electrodes 30, 31 of the quartz resonator element 1 via the fixed electrodes (see FIGS. 3A and 3B).

Thereby, the quartz resonator element 1 performs the flexing vibration as shown in FIG. 1.

As described above, in the quartz resonator 80, the quartz resonator element 1 is housed in the internal space S of the package 51 and the internal space S of the package 51 is air-tightly sealed, and thus, the resonator that exerts the same effect as that of the first embodiment may be provided.

Note that, in the quartz resonator 80, even if the quartz resonator element 101 of the modified example of the first embodiment is used in place of the quartz resonator element 1, the resonator that exerts the same effect as that of the first embodiment may be provided.

In the quartz resonator 80, the second substrate 55 and the third substrate 56 may be omitted by forming the lid body 57 in a flanged cap shape. Thereby, in the quartz resonator 80, the number of component elements is smaller and the manufacturing of the package 51 becomes easier.

Third Embodiment

As below, a quartz oscillator as an oscillator of the third embodiment will be explained as an example.

Figure 10:
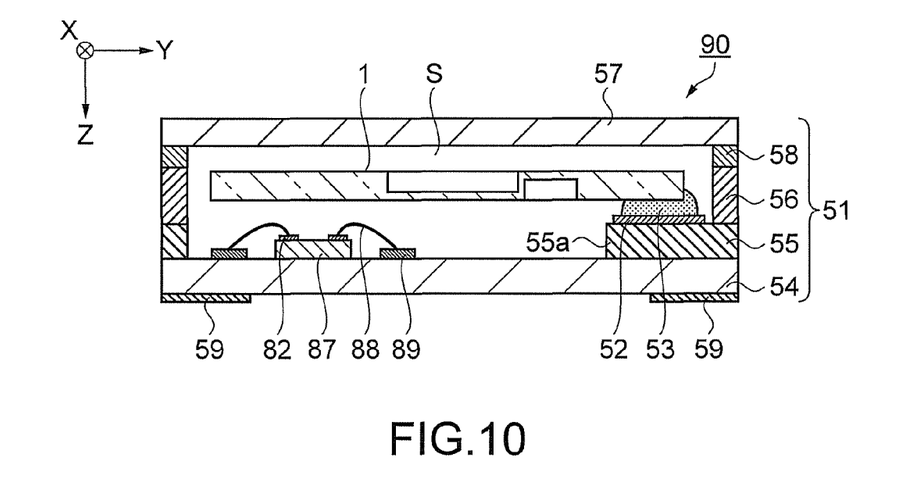
FIG. 10 is a schematic sectional view showing an outline configuration of a quartz oscillator of the third embodiment.

FIG. 10 is a schematic sectional view showing an outline configuration of the quartz oscillator of the third embodiment.

A quartz oscillator 90 of the third embodiment is a quartz oscillator using the quartz resonator element of the first embodiment or the modified example of the first embodiment. Here, the explanation will be made using the quartz resonator element 1 of the first embodiment. The quartz oscillator 90 of the third embodiment includes an IC chip 87 as a circuit device that drives the quartz resonator element in addition to the quartz resonator 80 of the second embodiment.

The same signs are assigned to the common parts with the first embodiment and the second embodiment and their explanation will be omitted.

As shown in FIG. 10, in the quartz oscillator 90, an internal connecting terminal 89 including Au etc. is formed on the upper surface of the first substrate 54 of the package 51.

The IC chip 87 having an oscillation circuit inside is housed in the internal space S of the package 51, and fixed to the upper surface of the first substrate 54 using an adhesive or the like. Further, on the upper surface of the IC chip 87, an IC connecting pad 82 including Au etc. is formed.

The IC connecting pad 82 is connected to the internal connecting terminal 89 using a metal wire 88.

The internal connecting terminal 89 is connected to the mounted terminal 59 formed on the outer bottom surface and the electrode parts 52 via the conducting pattern (not shown). A connecting method using flip-chip mounting other than the connecting method using the metal wire 88 may be used for the connection between the IC chip 87 and the internal connecting terminal 89.

The internal space S of the package 51 is air-tightly sealed.

In the quartz oscillator 90, alternating-current charge is applied between the excitation electrodes 30, 31 of the quartz resonator element 1 from the IC chip 87 via the electrode parts 52 and the fixed electrodes (not shown) by external input (see FIGS. 3A and 3B).

Thereby, the quartz resonator element 1 performs the flexing vibration as shown in FIG. 1. The quartz oscillator 90 outputs the oscillation signals obtained by the flexing vibration to the outside via the IC chip 87 and the mounted terminal 59.

As described above, in the quartz oscillator 90 of the third embodiment, the quartz resonator element 1 and the IC chip 78 are housed in the internal space S of the package 51 and the internal space S of the package 51 is air-tightly sealed, and thus, the resonator that exerts the same effect as that of the first embodiment may be provided.

Note that, in the quartz oscillator 90, even if the quartz resonator element 101 of the modified example of the first embodiment is used in place of the quartz resonator element 1, the resonator that exerts the same effect as that of the first embodiment may be provided.

The quartz oscillator 90 may have a configuration in which the IC chip 87 is attached to the outside of the package 51 (module structure).

In the third embodiment, the quartz oscillator has been explained as an example, however, not limited to that, but, for example, a pressure sensor, a gyro sensor, or the like further including a detection circuit in the IC chip 87 may be used.

Fourth Embodiment

As below, a cellular phone as an electronic apparatus of the fourth embodiment will be explained as an example.

Figure 11:
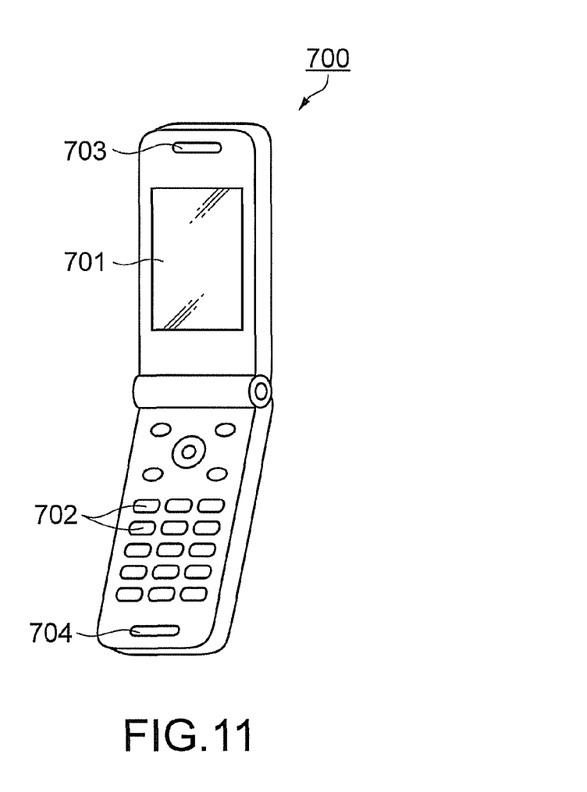
FIG. 11 is a schematic perspective view showing a cellular phone of the fourth embodiment.

FIG. 11 is a schematic perspective view showing the cellular phone of the fourth embodiment.

The cellular phone 700 of the fourth embodiment is a cellular phone using the quartz resonator element of the first embodiment or the modified example of the first embodiment.

The cellular phone 700 shown in FIG. 11 uses the above described quartz resonator element 1 (101) as a reference clock oscillation source, for example, and further includes a liquid crystal display device 701, plural operation buttons 702, an earpiece 703, and a mouth piece 704.

The above described quartz resonator element 1 (101) may preferably be used as a reference clock oscillation source not only of the cellular phone but also an electronic book, a personal computer, a television, a digital still camera, a video camera, a video recorder, a car navigation device, a pager, an electronic organizer, an electronic calculator, a word processor, a work station, a videophone, a POS terminal, and a device having a touch panel, and, in any case, an electronic apparatus that exerts the effect explained in the embodiment and the modified example may be provided.

As a material of the resonator element, not limited to quartz, but a piezoelectric material such as lithium tantalate ($LiTaO_3$), lithium tetraborate ($Li_2B_4O_7$), lithium niobate ($LiNbO_3$), lead zirconate titanate (PZT), zinc oxide (ZnO), or aluminum nitride (AlN), or a semiconductor such as silicon having a piezoelectric material such as zinc oxide (ZnO) or aluminum nitride (AlN) as a coating may be used.

What is claimed is:

1. A resonator element comprising:
    a base part; and
    a resonating arm part that extends from the base part in a first direction and performs flexing vibration,
    wherein the resonating arm part has one principal surface and the other principal surface opposed to the one principal surface,
    a first groove part provided along the first direction of the resonating arm part on the one principal surface,
    a second groove part provided in juxtaposition with the first groove part in a second direction orthogonal to the first direction in a plan view on the other principal surface,
    a third groove part provided in juxtaposition with the first groove part in the first direction in the plan view and provided nearer the base part side than the first groove on the other principal surface,
    a fourth groove part provided in juxtaposition with the second groove part in the first direction in the plan view and provided nearer the base part side than the second groove on the one principal surface,
    excitation electrodes disposed on side walls of the resonating arm part and within each of the first groove part, the second groove part, the third groove part, and the fourth groove part; and
    wherein a sum of a depth of the first groove part and a depth of the second groove part and a sum of a depth of the third groove part and a depth of the fourth groove part are larger than a distance between the one principal surface and the other principal surface.

2. The resonator element according to claim 1, wherein the excitation electrodes include first excitation electrodes that are disposed on the side walls of the resonating arm part and connect the one principal surface and the other principal surface and second excitation electrodes that are disposed within the first groove part, the second groove part, the third groove part, and the fourth groove part.

3. The resonator element according to claim 2, wherein the first excitation electrodes are disposed externally from the first groove part, the second groove part, the third groove part, and the fourth groove part.

4. The resonator element according to claim 3, wherein the second excitation electrodes are disposed on side surfaces of the first groove part, the second groove part, the third groove part, and the fourth groove part that are substantially parallel to the side walls of the resonating arm part.

5. The resonator element according to claim 2, wherein the second excitation electrodes are disposed on side surfaces of the first groove part, the second groove part, the third groove part, and the fourth groove part.

6. The resonator element according to claim 2, wherein the first excitation electrodes and the second excitation electrodes include opposite polarity.

7. The resonator element according to claim 1, wherein, given that lengths of the first groove part and the second groove part in the first direction are RS and lengths of the third groove part and the fourth groove part in the first direction are S, S:RS=1:(2.2 to 2.8).

8. The resonator element according to claim 1, wherein, given that lengths of the first groove part and the second groove part in the first direction are RS, lengths of the third groove part and the fourth groove part in the first direction are S, a length from a base to a distal end of the resonating arm part is A, and a sum of RS and S is L, $8.8992 \times (L/A)^2 - 3.3784 \times (L/A) + 1.746 \leqq RS/S \leqq 1.3102 \times (L/A)^2 + 3.3784 \times (L/A) + 0.854$.

9. The resonator element according to claim 8, wherein $RS/S = 5.1047 \times (L/A)^2 - 9 \times 10^{-14} \times (L/A) + 1.3$.

10. The resonator element according to claim 1, wherein the resonator element contains quartz.

11. A resonator using the resonator element according to claim 1, comprising:
   the resonator element; and
   a package housing the resonator element.

12. An oscillator using the resonator element according to claim 1, comprising:
   the resonator element; and
   a circuit device that drives the resonator element.

13. An electronic apparatus using the resonator element according to claim 1.

* * * * *